US012378693B2

(12) United States Patent
Balanetskyy et al.

(10) Patent No.: US 12,378,693 B2
(45) Date of Patent: Aug. 5, 2025

(54) CRYSTAL PIECE OF MONOCRYSTALLINE SILICON

(71) Applicant: SILTRONIC AG, Munich (DE)

(72) Inventors: Sergiy Balanetskyy, Freiberg (DE); Toni Lehmann, Oederan (DE); Karl Mangelberger, Ach (AT); Dirk Zemke, Ach (AT)

(73) Assignee: SILTRONIC AG, Munich (DE)

( * ) Notice: Subject to any disclaimer, the term of this patent is extended or adjusted under 35 U.S.C. 154(b) by 156 days.

(21) Appl. No.: 18/015,667

(22) PCT Filed: Jun. 30, 2021

(86) PCT No.: PCT/EP2021/068061
§ 371 (c)(1),
(2) Date: Jan. 11, 2023

(87) PCT Pub. No.: WO2022/012936
PCT Pub. Date: Jan. 20, 2022

(65) Prior Publication Data
US 2023/0257906 A1    Aug. 17, 2023

(30) Foreign Application Priority Data
Jul. 14, 2020   (EP) .................... 20185631

(51) Int. Cl.
C30B 29/06       (2006.01)
C30B 25/18       (2006.01)
C30B 33/10       (2006.01)
G01N 21/95       (2006.01)
C30B 15/00       (2006.01)

(52) U.S. Cl.
CPC ............ C30B 29/06 (2013.01); C30B 25/186 (2013.01); C30B 33/10 (2013.01); G01N 21/9501 (2013.01); C30B 15/00 (2013.01)

(58) Field of Classification Search
CPC ....................................... C30B 29/06
See application file for complete search history.

(56) References Cited

U.S. PATENT DOCUMENTS

2010/0162947 A1*  7/2010  Harada ............... C30B 15/10
                                                    117/206
2014/0150715 A1*  6/2014  Yamagata ........... C30B 15/10
                                                    65/17.6
2017/0044685 A1*  2/2017  Takazawa ........... C30B 15/206
2019/0194821 A1*  6/2019  Choi .................. C30B 33/08

FOREIGN PATENT DOCUMENTS

| CN | 101437988 A   | 5/2009  |         |
|----|---------------|---------|---------|
| EP | 1997940 A1    | 12/2008 |         |
| EP | 2725122 A1 *  | 4/2014  | C03B 11/02 |
| EP | 2990508 A1    | 3/2016  |         |
| KR | 20200024918 A * | 3/2020 |         |
| TW | 201348157 A   | 12/2013 |         |

* cited by examiner

Primary Examiner — Elizabeth E Mulvaney
(74) Attorney, Agent, or Firm — BROOKS KUSHMAN P.C.

(57) ABSTRACT

A crystal piece of monocrystalline silicon suitable for the production of semiconductor wafers has a length of not less than 8 cm and not more than 50 cm and a diameter of not less than 280 mm and not greater than 320 mm, wherein the fraction of the semiconductor wafers produced therefrom that are free from pinholes having a size of not more than 30 μm is greater than 98%.

16 Claims, 3 Drawing Sheets

CRYSTAL PIECE OF MONOCRYSTALLINE SILICON

CROSS REFERENCE TO RELATED APPLICATIONS

This application is the U.S. National Phase of PCT Appln. No. PCT/EP2021/068061 filed Jun. 30, 2021, which claims priority to European Application No. 20185631.7 filed Jul. 14, 2020, the disclosures of which are incorporated in their entirety by reference herein.

BACKGROUND OF THE INVENTION

1. Field of the Invention

The invention relates to a single silicon crystal which is particularly suitable for the production of semiconductor wafers from silicon.

2. Description of the Related Art

Monocrystalline semiconductor wafers are the foundation of modern-day electronics. During the production of components on these semiconductor wafers, the wafers undergo thermal operations with now highly complex coating steps.

Semiconductor wafers, especially silicon semiconductor wafers, are typically produced by first pulling a monocrystalline rod by means of the float zone method (FZ) or the Czochralski method (CZ). The rods produced accordingly are divided into crystal pieces by means of saws suitable for that purpose, such as wire saws, internal diameter saws or band saws, and these pieces are then processed to semiconductor wafers typically in a wire saw or internal diameter saw.

After further mechanical, chemo-mechanical and/or chemical steps, a layer may optionally be applied by means of CVD.

These semiconductor wafers thus produced are then made available to further component processing.

Appropriate quality assurance dictates the intensive deployment of analytical techniques which decide on the success or failure of the fabrication steps implemented. Typically, therefore, different measurement techniques are used, in some cases after individual treatment steps, in order on the one hand to monitor the production process and on the other hand to eliminate semiconductor wafers that are thought to be unusable. A semiconductor wafer here is typically evaluated using only the result of one single measurement method or one measurement parameter.

Where single crystals are pulled in accordance with the Czochralski method (CZ method) from a melt which is maintained in a quartz crucible, the crucible material forms the source of interstitial oxygen which is incorporated into the single crystal and into the semiconductor wafer obtained from it. The concentration of interstitial oxygen incorporated can be very precisely controlled, by means, for example, of pressure regulation and regulation of the flow of argon through the pulling apparatus, or by the coordination of crucible rotation and seed crystal rotation during the pulling of the single crystal, or by application of a magnetic field imposed on the melt, or by a combination of these measures. Generally speaking, the interstitial oxygen concentration measured in crystals produced by the CZ method is not less than $5 \times 10^{16}$ at/cm³ (new ASTM).

Interstitial oxygen plays an important part in the development of BMDs (Bulk Micro Defects). BMDs are oxygen precipitates formed by growth of BMD seeds in the course of a heat treatment. They act as internal getters, in other words as energy sinks for impurities, and are therefore an advantage in principle. One exception is their presence at locations where it is intended that electronic components are sited. In order to avoid BMDs forming in such locations, it is possible to deposit an epitaxial layer on the semiconductor wafer and provide for the electronic components to be sited in the epitaxial layer.

The crucible consists customarily of a material containing silicon dioxide, such as quartz. It is charged in general with chunks and/or granules of polycrystalline silicon, which is melted by means of a side heater disposed around the crucible and a base heater disposed beneath the crucible. After a phase of thermal stabilization of the melt, a monocrystalline seed crystal is immersed into the melt and lifted. During this procedure, silicon crystallizes on the end of the seed crystal that is wetted by the melt. The crystallization rate is influenced substantially by the velocity with which the seed crystal is lifted (crystal lift velocity) and by the temperature of the interface at which melted silicon undergoes crystallization. Through appropriate control of these parameters, a section is pulled first that is referred to as the "neck", in order to eliminate dislocations, followed by a conical section of the single crystal and lastly by a cylindrical section of the single crystal from which later the semiconductor wafers are sliced off.

As described in US-5 954 873 A, for example, the corresponding operational parameters during the crystal pulling process are adjusted in such a way as to achieve radially uniform distribution of defects in the crystal.

WO 98/45508 A1 is one of many publications to describe how the time profile of the pulling velocity v can be ascertained experimentally in order to control the pulling velocity v in such a way that the ratio v/G during the growth of the single crystal remains virtually unchanged and the single crystal is able to grow in an intended region. Furthermore, detection methods are described for the characterization and differentiation of $P_v$ region and $P_i$ region.

Liberated gaseous inclusions in the crucible material, gas which surrounds the chunks and/or the granules, silicon oxide forming in the melt, and gas diffusing into the melt are all considered possible causes of the formation of cavities in the single crystal that are called "pinhole" defects (not to be confused with COPs). They come about when gas bubbles reach the interface between the growing single crystal and the melt, and the single crystal crystallizes around these bubbles. If the parting planes intersect the cavities when the semiconductor wafers are sliced off, the resulting semiconductor wafers have circular depressions or holes with a diameter that may amount typically to several micrometers through several millimeters. Semiconductor wafers containing such cavities are unusable as substrate wafers for the production of electronic components.

The concentration of the pinholes formed in pieces of ingot can be measured, for example, by the scanning ultrasound method, which is described for example in DE 102 006032431 A1. That method detects pinholes from a diameter of about 50 μm. Determination of the precise size of the pinholes in each case, using this method, is hampered by relatively large measurement errors.

U.S. Pat. No. 9,665,931 A1 describes a corresponding method for determining the concentration and the respective size of pinholes in semiconductor wafers. This method allows the size of the pinholes to be stated with great accuracy.

In order to be able to measure precisely the size of pinholes in pieces of ingot, the ingot piece for measurement is subjected, in accordance with the prior art, to measurement as per DE 102 006 032431 A1 and the coordinates of the pinholes found are stored.

The zone containing corresponding pinholes is subsequently cut up into semiconductor wafers and analyzed by means of the method described in U.S. Pat. No. 9,665,931 A1. The size of the pinholes found accordingly can be determined in this way with a measurement inaccuracy of a few percent.

The justification for eliminating semiconductor wafers having pinholes is that substantial costs arise if the unsuitable or defective nature of the semiconductor wafer is detected only when it is undergoing treatment in component processing. Conversely, there is inevitably economic harm to the manufacturer of the semiconductor wafers if material is wrongly classed as being unfit for use.

There are different defects that may affect the semiconductor wafer. Depending on the component processing, both the defect type and also its appearance (position and form of appearance) decide whether the defect will be classed as harmful or of no critical importance as far as component processing is concerned.

For example, pinholes in the interior (i.e., remote from the surface) of a semiconductor wafer may be present without any observable consequence for component processing. If a pinhole is located on or in the vicinity of the surface, on the other hand, it does indeed develop a detrimental effect in component processing.

US 2008/0032429 A1 takes on this problem and describes a technique for a measurement method which on occurrence of a defect prepares additional images of the defect zone on the semiconductor wafer and uses them to specify the defect type within this region. Thus a defect once recognized by the system is measured again by means of further measurement data on the same measuring instrument, with the decision being either verified or falsified accordingly. This necessitates increased analytical effort and therefore increased costs.

In US 2008/0163140 A1, after a defect has been recognized, the coordinates of the defect on the semiconductor wafer are stored and a defect is subjected in a targeted way to a second measurement method. The purpose of this measuring step is to identify the defect type unambiguously. Here as well, increased costs arise through the application of a further measurement method.

Both of the methods described in the prior art are capable of verifying or falsifying a defect once it has been found. This is referred to as defect review. Both techniques are aimed at unambiguous identification of a defect once detected, using an additionally implemented measurement in a targeted way.

The background of this additional measurement is that measurement techniques used on a standard basis at present afford suitable classification only with limitations.

Each additional measurement technique first generates costs and secondly may lead to changes to the semiconductor wafer (for example, to contamination). These changes in turn preclude the use of the thus-analyzed semiconductor wafer in component processing. These techniques therefore cannot be deployed in the mass production of semiconductor wafers.

A series of proposals have also already been published as to how the formation of pinholes during crystal pulling can be suppressed. Many of these proposals place the focus on improving the properties of the crucible material.

There are also proposals (e.g.: EP 247 1980 A1) which optimize the furnishing of the crucible, in order to thus to prevent damage to the crucible and hence the formation of gas bubbles in the melt and thus of pinholes in the single crystal.

Other proposals concentrate on suppressing or eliminating pinholes during the melting period of the chunks and/or granules. For example, US 2011/304081 A1 recommends a gentle approach to managing the crucible, by means of suitable time-adjusting power distribution of the heaters that are used, in such a way as to reduce the density of the pinholes occurring in the crystal.

In order to achieve the desired (defect) properties of the crystal pulled, it is necessary to adjust the distribution of the heating power correspondingly in a fixed proportion. This contradicts, for example, the method proposed in DE10 339 792 A1. It is then possible therewith to achieve both objectives (low pinhole concentration and desired defect properties).

JP-5009097 A2 describes a method for producing a single silicon crystal wherein, during the melting of the polysilicon, the pressure in the crystal pulling unit is reduced to a pressure of 5 to 60 mbar and, during the pulling of the crystal, the pressure is 100 mbar or more.

US 2011/214603 A1 describes a technique for producing a single silicon crystal wherein the power of the heaters is set higher during melting than in the subsequent crystal pulling. In addition, the pressure during melt is set at 30 mbar or less, which is less than in the subsequent crystal pulling.

The inventors have recognized that ostensibly defect-free semiconductor material contains a relatively high concentration of pinholes. The technologies described in the prior art are able to solve a part of the problem, but it proves to be the case that the semiconductor wafers produced in accordance with the prior art still have a very high likelihood of failure during component production.

The inventors have also recognized that the techniques described in the prior art have further disadvantages. In particular it has been noted that the single crystals pulled had increased levels of carbon and iron impurities.

The inventors have additionally recognized that with the methods proposed in the prior art it is not possible to produce, by the Czochralski method, single crystals possessing not only a very low density of large pinholes but also a very low level of contamination with iron and carbon, while at the same time having the desired defect properties (defect-free).

The object of the invention to provide silicon crystals and semiconductor wafers produced from them that do not have the disadvantages described above.

SUMMARY OF THE INVENTION

These and other objects are achieved by means of a crystal piece of monocrystalline silicon which is intended for the production of semiconductor wafers, having a length of not less than 8 cm and not more than 50 cm and a diameter of not less than 280 mm and not greater than 320 mm, wherein the fraction of the semiconductor wafers produced therefrom that are free from pinholes having a size of not more than 30 µm is greater than 95%. The objects are further achieved by the methods and products described herein.

DETAILED DESCRIPTION OF THE PREFERRED EMBODIMENTS

Figure 1:
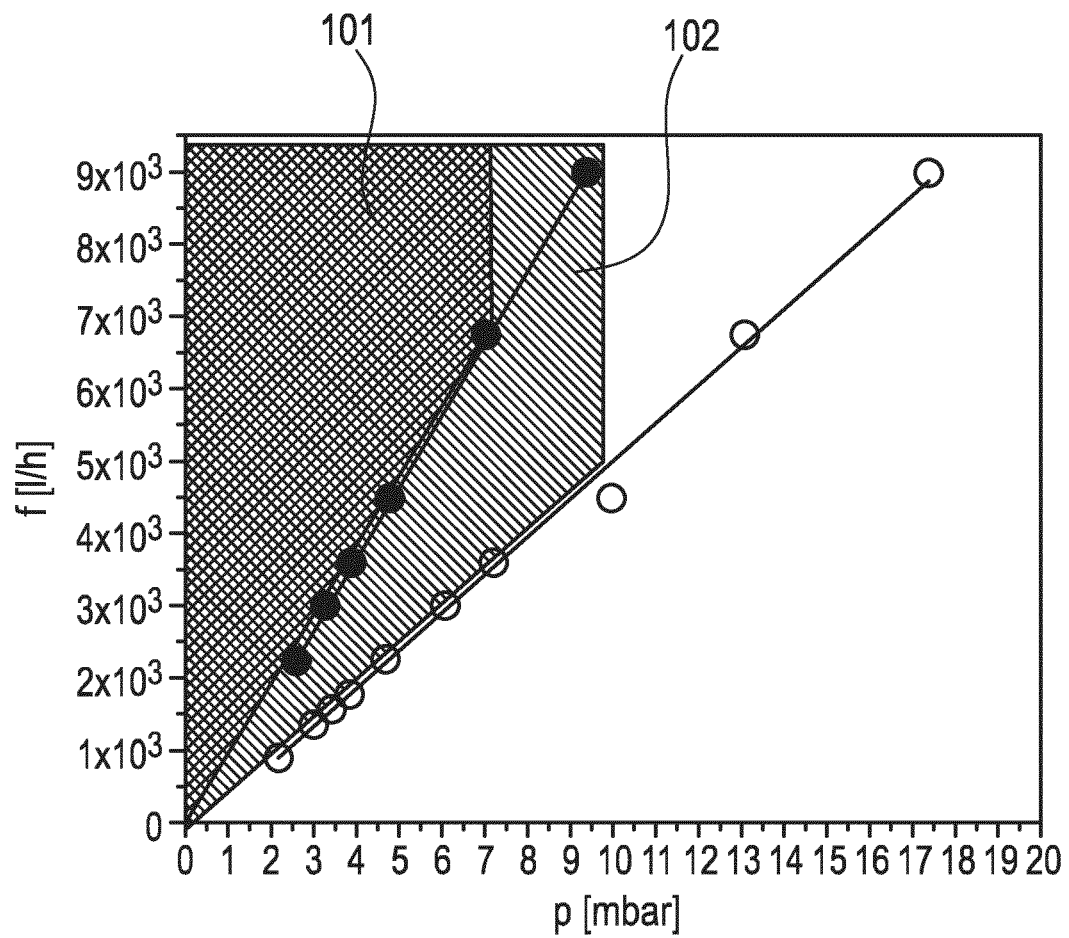
FIG. 1 shows the relation of the flow rate f [l/h] of the inert gas as a function of the plant pressure p [mbar].

The features reported in relation to the embodiments of the method of the invention, set out above, can be transposed correspondingly to the products of the invention. Conversely, the features reported for the embodiments of the products of the invention, set out above, can be transposed correspondingly to the method of the invention. These and other features of the embodiments of the invention are elucidated in the description of the figures and the claims. The individual features may be realized either separately or in combination as embodiments of the invention. Additionally, they may describe advantageous configurations which are protectable independently.

MWS (multi wire saw) refers to the simultaneous slicing of semiconductor wafers from a crystal piece by means of a sawing wire. A generic description of this method is given in WO18149631 A1.

ENG (edge notch grinding) refers to the method for edge rounding that is reproduced generically in DE102013212850 A1.

CMP (chemical mechanical polishing) refers to polishing wherein, using an unbonded abrasive and suitable chemical agents, ablative polishing is brought about on one side of the semiconductor wafer. Further details are described for example in DE 10 2008 045 534 B4.

Double-sided polishing (DSP) is a method from the group of the chemo-mechanical processing steps (CMP). DSP processing of semiconductor wafers is described for example in US 2003/054650 A1, and an apparatus suitable for this purpose in DE 100 07 390 A1. DSP encompasses chemical etching using an alkali, and mechanical erosion using unbonded abrasive which is dispersed in the aqueous medium and which is brought into contact with the semiconductor wafer by means of a polishing cloth that contains no hard substances entering into contact with the semiconductor wafer; in this way, material is ablated from the semiconductor wafer under pressure and reciprocal movement.

CVD stands for chemical vapor deposition and is described generically in WO19020387 A1.

DDG (double-sided grinding) is a technique for mechanical ablation using bonded abrasive in a carrier—for example, a grinding disk. This method is described illustratively in DE 10 2017 215 705 A1.

Etch (etching) refers to the chemically or alkali-induced ablation of the semiconductors. This method is described illustratively in U.S. Pat. No. 7,829,467 B2.

Edge Round (edge rounding) refers to the mechanical rounding of the edges of the semiconductor wafer.

Edge Polish (edge polishing) refers to the polishing of the edges of the semiconductor wafer.

Resistance measurement (resistance) refers to the measuring of the electrical resistance of the monocrystalline silicon. Preferred for this purpose is the measurement technique known as four-point measurement, although other techniques can also be used.

Light scattering is understood to refer to measurement techniques such as, for example, MO6, MO4, LLS, IR-LST (localized light scattering). With this technique, the object under analysis—that is, the silicon wafer—is scanned with a beam of light, and the light scattered and/or the light reflected at irregularities on the surface or within the volume are/is recorded using a detector. In the case of scattered light, a term used is dark-field inspection; the detection of the reflected light is referred to as light-field measurement (see also SEMI standard M52).

Using infrared depolarization (SIRD), a semiconductor wafer is scanned using an infrared beam. In this scan, inhomogeneities in the polarization of the reflected or transmitted laser light are recorded with spatial resolution in order to determine possible local stresses in the material.

In the case of ultrasound measurement (ultrasound) a sample is trans-irradiated with ultrasound. Where the soundwave strikes irregularities, reflection occurs, and is detected. The sample here is likewise scanned. Together with the measurement of the transit time for the wave, it is possible to determine with precision the local position of the irregularity.

Lifetime measurement of the minority charge carriers (lifetime): determination of the recombination lifetime of generated free charge carriers into states below the Fermi energy, with compliance with the pulse response on crystal defects and impurities (reference: SEMI standard MF1535).

Measurement of the free path length of the minority charge carriers (free path length): this is calculated from the lifetime and the free diffusion constant (physical constant, reference: SEMI standard MF 391).

Measurement of the local geometry (local geometry): for this technique, the local variation in the flatness and/or thickness of the sample is determined by capacitive measurement, by interferometry or by triangulation (see also SEMI standard M49).

Microscopy (electron microscopy, optical microscopy in the visible light wavelength range): microscopes are used for routine monitoring of specific zones of the silicon wafer after corresponding manufacturing steps. These zones include in particular the marginal zone, the notch zone, zones of the laser marking, and contact points with wafer handling and placement systems.

Mass spectroscopy and x-ray fluorescence are routinely employed for identification—in some cases with local resolution—of extraneous atoms in the silicon and for determination of the concentration of such atoms.

FTIR can be used to ascertain the thickness of a layer (e.g., of epitaxial layers or oxide layers) and also—via spectral analysis—the concentration of extraneous atoms such as O, C, H and N.

LLS (localized light scattering) identifies a light scattering point recognized on a wafer surface by light scattering.

FIG. 1 shows the relation of the flow rate f [l/h] of the inert gas as a function of the plant pressure p [mbar]. The area identified by (102) represents a preferred range, and the area identified by (101) a particularly preferred range, for the ratio between pressure and flow rate for the melting silicon s.

The skilled person understands the unit l/h (liters per hour) to refer to standard liters per hour, in other words the volume per unit time that the gas would have under standard pressure.

Figure 2:
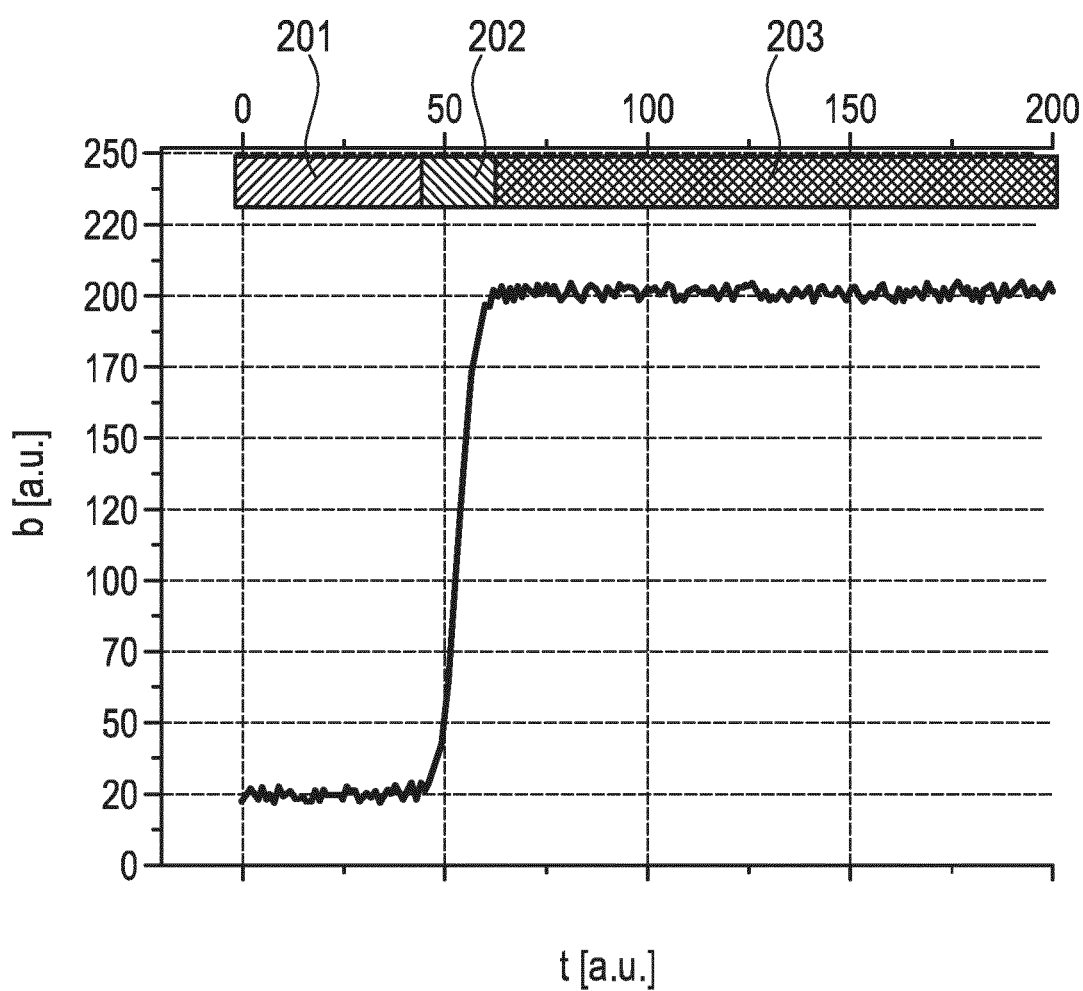
FIG. 2 shows a typical time profile of the brightness, measured by a camera, during heating of the silicon s, in terms of brightness values b in relative units in each case.

FIG. 2 shows a typical time profile of the brightness, measured by a camera, during heating of the silicon s, in terms of brightness values b in relative units in each case. The designation (201) stands for the zone in which the silicon is still solid, and the designation (203) for the zone in which the silicon is already completely liquid. The designation (202) stands for the zone in which the silicon is both still solid and also already partly liquid.

Figure 3:
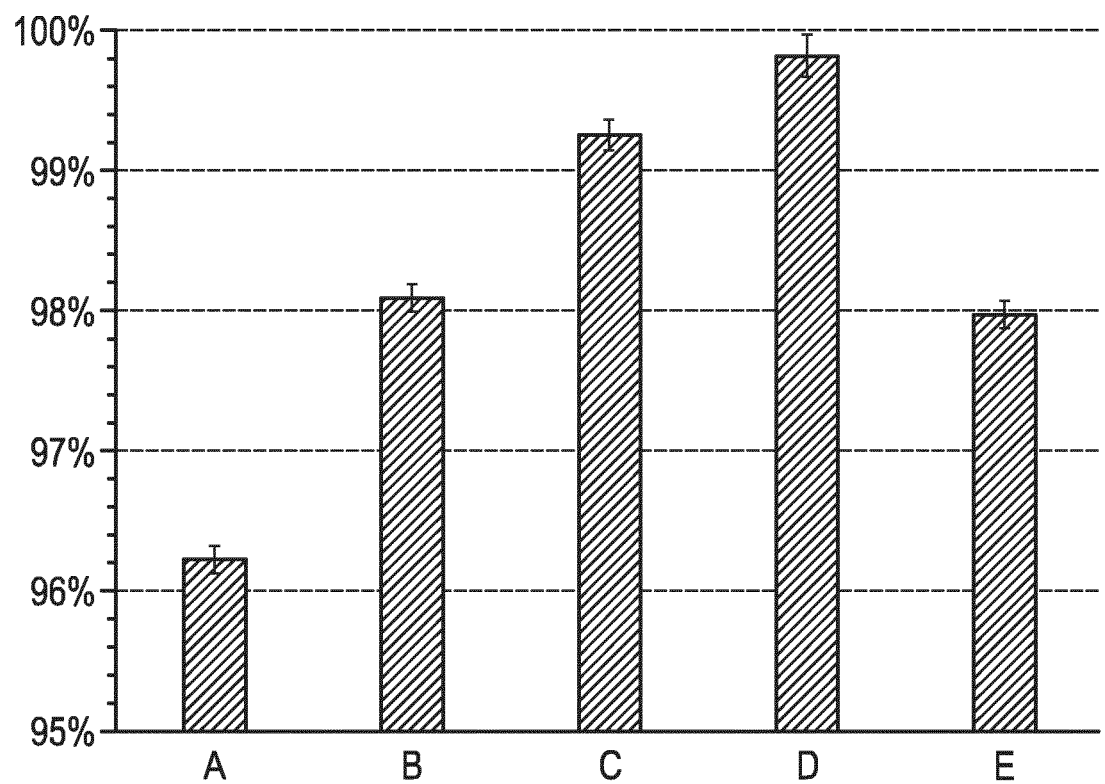
FIG. 3 shows the fraction of the semiconductor wafers, in percent, which have been tamed from a crystal piece and have no pinholes.

The ordinate in FIG. 3 shows the fraction of the semiconductor wafers, in percent, which have been tamed from a crystal piece and have no pinholes. The designations A to E here stand for different experimental conditions, which are explained later on.

A number of crystals were pulled from a crucible by means of the Czochralski pulling method. Measurements were made both of the mean free path length of the minority charge carriers (SPV) and the length of the non-dislocated crystal. The length of the non-dislocated fraction of the crystal was expressed in relation to the theoretically achievable overall length.

During crystal pulling, means known from the prior art were used in order to produce defect-free crystals. This can be achieved in principle with a CUSP magnetic field, with a horizontal magnetic field or with a traveling magnetic field. Furthermore, crystal rotation and crucible rotation are set appropriately for this purpose.

The characteristic mean free path length of the minority charge carriers was expressed in relation to the measured maximum free path length. This statistic is used hereinafter as a quality criterion for possible impurities that might be present in the crystal and disrupt the components subsequently fabricated on the silicon. Theoretically it would also be possible to use other statistics for the quality of the crystals. Examples thereof are a lifetime measurement by µPCD and alternatively a chemical analysis of the resultant silicon by ICP-MS. A number of suitable methods are available here to the skilled person.

The inventors have identified the above-described measuring techniques as being the appropriate techniques and in particular as being readily accessible.

The concentration of carbon in the silicon was measured by means of gas fusion analysis, which is being described for example in DE 1020 14217514 A1. It is also possible as an alternative to use FTIR.

The concentration of iron was measured using the ICPMS (inductively coupled plasma-mass spectrometry) method. It can also be measured by NAA (neutron activation analysis) carried out with appropriate calibration.

Each monocrystalline ingot pulled according was divided into ingot pieces using a band saw, and subsequently cut into wafers, which were examined for pinholes, for defect properties, and for impurities (carbon, iron).

The inventors have recognized that the use of crucibles manufactured according to the prior art has distinct disadvantages if a crucible is used to pull a plurality of crystals in succession by the Czochralski method. Crystal pulling also appeared to be more difficult as the duration of the pulling process increased.

If crystals are pulled with a crucible which—as described in the prior art—has been produced from naturally obtained $SiO_2$ and whose inside has been coated with a barium-containing component, it was found that the length of the dislocation-free fraction of the crystals remains high, but a considerable drop is apparent in the mean free path length. Accordingly, the mean free path length falls on average to 70% of the initial value. It is therefore not the case that crystals with consistent quality can be produced with such a crucible.

Where crystals are pulled using a crucible which—as described in the prior art—has been produced from synthetically obtained $SiO_2$ and whose inside has been coated with a barium-containing component, a greatly increased scatter is found in the measured free path length.

Even under optimum conditions, for example, a crystal exhibits a mean free path length which is smaller by on average 10%. Crystals of this quality are not sufficient for the semiconductor industry. The length of the dislocation-free fraction of the crystals thus obtained also exhibits unacceptable scatter that would lead to corresponding economic damage.

The inventors first identified the crucible material as a cause of the shortcomings measured, and undertook extensive experiments to eliminate the shortcomings.

It is known from the prior art that β-cristobalite has a higher melting temperature than quartz. It is also known that there are certain crystallization promoters which sometimes favor the generation of β-cristobalite.

Another known fact is that quartz crucibles made from synthetically obtained $SiO_2$ have different properties from quartz crucibles made from naturally obtained $SiO_2$.

The inventors surprisingly found that a fused silica crucible having an inside on which there is an inner layer of fused silica that forms a surface, where the inner layer is provided with a crystallization promoter, exhibits positive properties in terms of the multiple pulling of crystals from a crucible, specifically when the concentration C of synthetically obtained $SiO_2$ at one distance from the surface is greater than the concentration of synthetically obtained $SiO_2$ at a further distance from the surface.

Substances having a particularly preferred effect here as crystallization promoters include barium and strontium, with barium being especially preferred.

The inventors have also recognized that it is advantageous if the concentration C of synthetically obtained $SiO_2$ is greater than 90% when the distance from the surface is less than 0.4 mm.

Further experiments unexpectedly revealed that advantages arise in relation both to the quality (SPV) and to the fraction of dislocation-free length of the crystal if the relationships applying to the concentration of synthetically obtained $SiO_2$ as a function of the distance d are as follows:

$$C\ [\%] <= 100 - (d\ [\text{mm}] - 0.25) \times 30 \text{ and}$$

$$C\ [\%] >= 100 - (d\ [\text{mm}] + 0.25) \times 80.$$

The inventors succeeded in narrowing down the range somewhat through further experiments, and found that advantages arise in relation both to the quality (SPV) and to the fraction of dislocation-free length of the crystal if the relationships applying to the concentration of synthetically obtained $SiO_2$ as a function of the distance d are as follows:

$$C\ [\%] <= 100 - (d\ [\text{mm}] + 0.1) \times 80$$

$$\text{and } C\ [\%] >= 100 - (d\ [\text{mm}] - 0.05) \times 36.$$

With particular preference here, the concentration of the crystal promoter is less than 1 ppba and greater than 0.05 ppba, based on silicon.

Single crystals produced using the crucible material just described were subsequently processed into semiconductor wafers.

The inventors here have found that the processing of the crystal pieces into semiconductor wafers must be modified in order to provide better detection of harmful pinholes and so to enable more effective and rapid optimization of the corresponding overarching measures.

After the corresponding manufacturing steps, measurements are typically conducted which result in the semiconductor wafer either being eliminated or being approved for the next processing step.

This approach was modified by carrying out measurements, after the individual manufacturing steps for the production of semiconductor wafers, and using the measurement methods apparently suitable for these measurements, and storing the results in a database. Here, independently of the measurement outcome, the individual semiconductor wafer is always approved for the next intended fabrication step. The measurement outcome in this context is regarded as the nature of the possible abnormality or defect, the local coordinates of this abnormality or defect, the measurement method used (including specifics), and the nature of the fabrication step.

The inventors have recognized that the entirety of the measurement outcomes after all of the manufacturing steps conducted and their associated measurements leads to substantially improved assessment of the material.

This technique proves to be very advantageous relative to the assessment of the data of individual measurement outcomes after each fabrication step. The combining of measurement data after different process steps makes it possible to specify with greater precision both the origin and hence the nature of a defect and also the position thereof on or in the semiconductor wafer. The quality of the identification of defects and the associated assessment of a semiconductor wafer in terms of suitability for component processing can be optimized accordingly.

The crystal pieces produced were analyzed with an ultrasound measurement, and the results (coordinates of the possible irregularities in the crystal) were stored. The crystal pieces were subsequently cut into semiconductor wafers by MWS, irrespective of the results already obtained. IR measurements were subsequently conducted on the resultant semiconductor wafers, and the results of these measurements were again stored with spatial resolution.

At locations at which the IR measurement show abnormalities, an additional control measure carried out, as proposed in the prior art as a secondary measurement, was a defect review, with a further IR measurement at greater resolution. These data were used in order to obtain an assessment of the abnormalities, as proposed in the prior art. In contrast to the prior art, however, the semiconductor wafers exhibiting a possibly harmful defect were not discarded, but instead underwent the next fabrication steps. The same principle was also employed for the subsequent steps. At the end, the additional data obtained in this way were used as a data basis for the subsequent verification of the inventive technique.

After double-side polishing (DSP), the semiconductor wafers obtained were subjected to an IR measurement, and the data were again stored with spatial resolution.

After a further treatment of the semiconductor wafers by CMP, the semiconductor wafers were subjected to an SIRD measurement and the data therefrom were stored with spatial resolution. Moreover, after CMP, the semiconductor wafers underwent light scattering measurement of the front side and of the back side, and the resulting data were stored with spatial resolution.

Some of the semiconductor wafers obtained in this way were processed further by means of CVD treatment and then analyzed by means of light scattering measurement on the front and back sides, with all of the data being again stored with spatial resolution.

A summary of the fabrication steps used, with the measurements carried out in relation to these steps, is shown in table 1.

TABLE 1

| # | Fabrication step | Measurement after the fabrication step |
|---|---|---|
| 1 | Crystal pulling | Ultrasound measurement: Detection of irregularities in the crystal |
| 2 | MWS | IR measurement Detection of irregularities on/in the silicon wafer |
| 3 | DSP | IR measurement Detection and partial classification of irregularities on/in the silicon wafer |
| 4 | CMP | SIRD measurement |
| 5 | CMP | Light scattering measurement on front and back sides and edge Detection and partial classification of irregularities on/in the silicon wafer |

At the end, all of the measurement outcomes were analyzed in an overall appraisal.

Here, surprisingly, the inventors ascertained that the smallest size of the pinholes found accordingly is about 7 μm. It was also found that the maximum size of the pinholes found is 30 μm.

Alternatively, though insignificantly greater time and therefore not preferably, the semiconductors wafer obtained can also be analyzed for the incidence of pinholes by means of infrared microscopy (for example, with SIRD in transmission). The minimum size of the pinholes measured is in this case likewise 7 μm.

Looking at the overall results, the inventors ascertained that in spite of the optimized crucible material employed, pinholes to a considerable degree still mean that the fraction of the semiconductor wafers of a crystal piece that are not suitable for component processing is about 3.8%. FIG. 3 shows in column A the fraction of the semiconductor wafers which are without measured pinholes (about 96.2%). The iron contamination measured was less than $1.0 \times 10^{10}$ at/cm$^3$, and the carbon contamination found was not more than $7 \times 10^{14}$ at/cm$^3$. With the pulling methods used, it was possible to establish an oxygen concentration of between $1 \times 10^{17}$ and $7 \times 10^{17}$ at/cm$^3$ (new ASTM). The resistance was set at between 1 mohmcm and 1 ohmcm.

Using the modified crucible material, the furnishing and melting of the polysilicon in the crucible were then modified.

It proved advantageous to use silicon having a mean mass-based specific surface area of less than 2 cm$^2$/g.

With very particular preference, the crucible is oriented at a distance of less than 5 cm and greater than 2 cm from the crucible wall with polysilicon having a mass-specific surface area of less than 1 cm$^2$/g. The remainder of the crucible volume is equipped with polysilicon having a mass-specific surface area of greater than 1 cm$^2$/g and less than 5 cm$^2$/g. The final outcome is shown in FIG. 3 in column E. About 98% of the wafers are free from pinholes. This measure as well, therefore, improves the yield.

When the polysilicon is melted, a pressure of preferably not greater than 10 mbar is established in the crystal pulling plant. At the same time, preferably, the overall flow rate f of a purging gas through the pulling plant is set such that it is greater than the flow rate f [l/h] multiplied by 160.

FIG. 1 here shows the preferred area made up of pressure p and flow rate f.

With particular preference, the entire flow rate of a purging gas through the pulling plant is set such that it is greater than the flow rate f [l/h] multiplied by 400 and very preferably 720. The pressure set in this case is preferably not greater than 10 mbar.

Generally speaking, it is advantageous to keep the flow rate f as high as possible and at the same time to give the pressure as low as possible. The maximum flow rate for a given pressure is dependent merely on the pump power.

The purging gas used during melting comprises gases from the list of the gases argon, helium, nitrogen or combinations thereof. Preference is given to using argon having a purity of more than 99.99 vol %.

Column C of FIG. 3 shows the result of this measure. More than 99% of the wafers are free from pinholes.

In a further embodiment, the pressure (and hence also the flow rate of the purging gas) was increased as soon as the first polysilicon became liquid. The pressure increase in this case was 4 mbar, preferably 8 mbar, and very preferably 12 mbar.

The melting operation here was observed with a camera which uses suitable techniques of digital image processing to determine the point in time from which the first silicon became liquid.

The inventors have recognized that the time at which it is possible to ascertain a significant increase in the brightness of the image data analyzed can be correlated very effectively with the timing at the start of the phase transition from solid to liquid.

FIG. 2, for example, plots the brightness as a function of time. It was found that preferably in the time between the zones (201) and (202), the pressure should be increased in order to achieve a further positive effect in terms of the density of pinholes and the concentration of carbon and iron.

Column D in FIG. 3 shows the results for crystals achieved with means of the invention as described above. In this case more than 99.8% of the wafers are free from pinholes.

In an additional embodiment, polysilicon was used for the furnishing that had a chlorine content of more than 1 ppba.

The inventors here have recognized that, surprisingly, the use of polysilicon having a chlorine content of greater than 1 ppba has further positive consequences for the iron contamination, despite the assumption by the skilled person that at high temperatures, chlorine would inevitably release iron from the plant and contaminate the silicon. The Fe contamination achieved in this way was determined as being less than $5.0 \times 10^9$ at/cm$^3$.

What is claimed is:

1. A crystal piece of monocrystalline silicon suitable for the production of semiconductor wafers and cut from a Czochralski silicon monocrystal, the crystal piece having a length of not less than 8 cm and not more than 50 cm and a diameter of not less than 280 mm and not greater than 320 mm, wherein
    a measurement shows that the fraction of the semiconductor wafers produced therefrom that are free from pinholes having a size of not more than 30 μm and greater than 7 μm is greater than 98%, where the measurement comprises, in the order given:
        (a) analyzing the crystal piece with an ultrasound measurement, with the coordinates of the irregularities found being stored,
        (b) producing semiconductor wafers from the crystal piece by a multi-wire saw,
        (c) analyzing all of the semiconductor wafers by means of a first IR measurement and storing the results of the first IR measurement with spatial resolution,
        (d) polishing all of the semiconductor wafers by double-side polishing and then analyzing all of the semiconductor wafers of a second IR measurement and storing the results of the second IR measurement with spatial resolution,
        (e) chemical-mechanically polishing all of the semiconductor wafers to produce polished semiconductor wafers and then subjecting the polished semiconductor wafers to SIRD measurement, the results being stored with spatial resolution,
        (f) measuring the front side and the back side of all of the semiconductor wafers by light scattering and storing the resulting data with spatial resolution, and
        (g) analyzing all of the measurement results thus obtained.

2. The crystal piece as claimed in claim 1, wherein the crystal piece comprises interstitial oxygen at not less than $1 \times 10^{17}$ at/cm$^3$ and not more than $7 \times 10^{17}$ at/cm$^3$ (new ASTM).

3. The crystal piece as claimed in claim 1, wherein the crystal piece comprises interstitial oxygen at not less than $3 \times 10^{17}$ at/cm$^3$ and not more than $6 \times 10^{17}$ at/cm$^3$ (new ASTM).

4. The crystal piece of claim 1, wherein at least one fraction of all the semiconductor wafers produced have both a region $P_i$ in which silicon interstitials are dominant and a region $P_v$ in which silicon vacancies are dominant.

5. The crystal piece of claim 4, wherein the sum of the area of the region $P_v$ and the area of the region $P_i$ is greater than 95% of the area of semiconductor wafer.

6. The crystal piece of claim 4, wherein the sum of the area of the region $P_v$ and the area of the region $P_i$ is greater than 99% of the area of semiconductor wafer.

7. The crystal piece as claimed in claim 5, wherein the area of the region $P_v$ is less than 10% of the area of the semiconductor wafer.

8. A crystal piece of monocrystalline silicon suitable for the production of semiconductor wafers and cut from a Czochralski silicon monocrystal, the crystal piece having a length of not less than 8 cm and not more than 50 cm and a diameter of not less than 280 mm and not greater than 320 mm, wherein
    a measurement shows that the fraction of the semiconductor wafers produced therefrom that are free from pinholes having a size of not more than 30 μm and greater than 7 μm is greater than 98%, where the measurement comprises, in the order given:
        (a) analyzing the crystal piece with an ultrasound measurement, with the coordinates of the irregularities found being stored,
        (b) producing semiconductor wafers from the crystal piece by a multi-wire saw,
        (c) analyzing all of the semiconductor wafers by means of a first IR measurement and storing the results of the first IR measurement with spatial resolution,
        (d) polishing all of the semiconductor wafers by double-side polishing and then analyzing all of the semiconductor wafers of a second IR measurement and storing the results of the second IR measurement with spatial resolution,
        (e) chemical-mechanically polishing all of the semiconductor wafers to produce polished semiconductor wafers and then subjecting the polished semiconductor wafers to SIRD measurement, the results being stored with spatial resolution,
        (f) measuring the front side and the back side of all of the semiconductor wafers by light scattering and storing the resulting data with spatial resolution, and (g) analyzing all of the measurement results thus obtained, wherein a carbon (C) impurity is less than $7 \times 10^{14}$ at/cm$^3$ and at the same time an iron (Fe) impurity is less than $1.0 \times 10^{10}$ at/cm$^3$.

9. The crystal piece of claim 8, wherein the carbon (C) impurity is less than $5.5 \times 10^{14}$ at/cm$^3$, and at the same time the iron (Fe) impurity is less than $5.0 \times 10^9$ at/cm$^3$.

10. The crystal piece of claim 1, wherein the resistance measured on each semiconductor wafer is not less than 1 mohmcm and not greater than 1 ohmcm.

11. A method for producing semiconductor wafers from a crystal piece of claim 1, comprising:
cutting the crystal piece by means of a wire saw into semiconductor wafers, polishing the semiconductor wafers, and optionally coating the semiconductor wafers with an epitaxial coating.

12. A crystal piece of monocrystalline silicon suitable for the production of semiconductor wafers and cut from a Czochralski silicon monocrystal, the crystal piece having a length of not less than 8 cm and not more than 50 cm and a diameter of not less than 280 mm and not greater than 320 mm, wherein
a measurement shows that the fraction of the semiconductor wafers produced therefrom that are free from pinholes having a size of not more than 30 μm and greater than 7 μm is greater than 98%, where the measurement comprises, in the order given:
(a) analyzing the crystal piece with an ultrasound measurement, with the coordinates of the irregularities found being stored,
(b) producing semiconductor wafers from the crystal piece by a multi-wire saw,
(c) analyzing all of the semiconductor wafers by means of a first IR measurement and storing the results of the first IR measurement with spatial resolution,
(d) polishing all of the semiconductor wafers by double-side polishing and then analyzing all of the semiconductor wafers of a second IR measurement and storing the results of the second IR measurement with spatial resolution,
(e) chemical-mechanically polishing all of the semiconductor wafers to produce polished semiconductor wafers and then subjecting the polished semiconductor wafers to SIRD measurement, the results being stored with spatial resolution,
(f) measuring the front side and the back side of all of the semiconductor wafers by light scattering and storing the resulting data with spatial resolution, and
(g) analyzing all of the measurement results thus obtained, wherein the Czochralski silicon monocrystal has an iron concentration of less than $1.0 \times 10^{10}$ at/cm$^3$.

13. The crystal piece of claim 12, wherein the iron concentration is less than $5.0 \times 10^9$ at/cm$^3$.

14. A method for producing semiconductor wafers from a crystal piece of claim 8, comprising:
cutting the crystal piece by means of a wire saw into semiconductor wafers, polishing the semiconductor wafers, and optionally coating the semiconductor wafers with an epitaxial coating.

15. A method for producing semiconductor wafers from a crystal piece of claim 12, comprising:
cutting the crystal piece by means of a wire saw into semiconductor wafers, polishing the semiconductor wafers, and optionally coating the semiconductor wafers with an epitaxial coating.

16. The crystal piece of monocrystalline silicon of claim 1, wherein the crystal piece is derived from a second or further Czochralski silicon monocrystal grown in the same crucible as a first Czochralski silicon monocrystal has previously been grown, and the crystal piece from the second or further Czochralski silicon monocrystal has a mean free path length of minority charge carriers which has a value which is, on average, not more than 10% lower than the value of the mean free path length of the minority charge carriers of the crystal piece from the first Czochralski silicon monocrystal.

\* \* \* \* \*